United States Patent
Zundel et al.

(10) Patent No.: US 8,772,861 B2
(45) Date of Patent: Jul. 8, 2014

(54) FIELD EFFECT TRENCH TRANSISTOR HAVING ACTIVE TRENCHES

(75) Inventors: Markus Zundel, Egmating (DE); Norbert Krischke, München (DE); Thorsten Meyer, München (DE)

(73) Assignee: Infineon Technologies AG, Neubiberg (DE)

( * ) Notice: Subject to any disclaimer, the term of this patent is extended or adjusted under 35 U.S.C. 154(b) by 667 days.

(21) Appl. No.: 11/230,705

(22) Filed: Sep. 20, 2005

(65) Prior Publication Data

US 2006/0071276 A1  Apr. 6, 2006

(30) Foreign Application Priority Data

Sep. 20, 2004 (DE) .......................... 10 2004 045 467

(51) Int. Cl.
*H01L 29/66* (2006.01)
(52) U.S. Cl.
USPC .................. 257/328; 257/356; 257/E27.014
(58) Field of Classification Search
USPC .................. 257/356, E27.014, 328
See application file for complete search history.

(56) References Cited

U.S. PATENT DOCUMENTS

| 6,566,708 | B1 | 5/2003 | Grover et al. | |
| 7,345,342 | B2 * | 3/2008 | Challa et al. | 257/341 |
| 2001/0041407 | A1 * | 11/2001 | Brown | 438/270 |

FOREIGN PATENT DOCUMENTS

| DE | 100 01 865 | 8/2001 | |
| DE | 102 50 175 | 5/2004 | |
| GB | 2 341 001 | 3/2000 | |
| JP | 2001257349 A | * 9/2001 | ............. H01L 29/78 |

OTHER PUBLICATIONS

Translation of Oikawa/Yobikawa et al. of JP 2001-257349.*

* cited by examiner

*Primary Examiner* — Hsin-Yi Hsieh

(74) *Attorney, Agent, or Firm* — Dicke, Billig & Czaja, PLLC

(57) ABSTRACT

One embodiment of the invention relates to a field effect trench transistor with a multiplicity of transistor cells that are arranged like an array and whose gate electrodes are arranged in active trenches formed in a semiconductor body. Inactive trenches are arranged in the array of the transistor cells, there being no gate electrodes situated in said inactive trenches, and a series of polysilicon diodes are integrated in one or more of the inactive trenches which diodes, for protection against damage to the gate oxide through ESD pulses, are contact-connected to a source metallization at one of their ends and to a gate metallization at their other end, and/or alternatively or additionally one or more polysilicon zener diodes connected in series is or are integrated in the inactive trench or trenches and contact-connected to the gate metallization by one of its or their ends and to drain potential by its or their other end.

12 Claims, 3 Drawing Sheets

Prior Art

FIELD EFFECT TRENCH TRANSISTOR HAVING ACTIVE TRENCHES

CROSS-REFERENCE TO RELATED APPLICATIONS

This Utility Patent Application claims priority to German Patent Application No. DE 10 2004 045 467.1, filed on Sep. 20, 2004, which is incorporated herein by reference.

BACKGROUND

The invention relates to a field effect trench transistor with a multiplicity of transistor cells that are arranged like an array and whose gate electrodes are arranged in active trenches formed in a semiconductor body.

If, in applications of a field effect trench transistor, for example a DMOS power transistor as a high-side or low-side switch in motor vehicle ignition devices, a driver chip and the associated field effect power transistor are soldered separately on a circuit board, the leads may vary greatly depending on the application situation or customer requirements and, in principle, are exposed on the circuit board. This means that the signal exchange between the field effect trench transistor relating to signals from the temperature sensors and/or current sensors and the driver chip is subject to fluctuations in said leads and, moreover, there is the risk of individual or all components being destroyed by human ESD pulses coupled in via said leads. ESD pulses of this type may be coupled into the power transistor, for example, by the hand when touching such exposed regions or conductor tracks and destroy the gate oxide of said transistor.

In the case of an IGBT of the prior art, in order to protect the gate oxide from ESD pulses, planar diodes are provided between source metallization and gate metallization, as is illustrated for example in the accompanying FIG. 3. Here the planar diodes are realized by polysilicon diodes (n p n p n) on thick oxide above the silicon surface O and are contact-connected to a source metallization SM at one of their ends and to a gate metallization GM at their other end. In between, the surface of said polysilicon diodes is insulated by a dielectric DE. In order to obtain sufficiently low leakage currents and small drifts in this concept, the latter resorted to $p^+n$ poly-diodes. By virtue of many individual diodes of this type being connected in series, it was possible to set reverse voltages as desired in steps of approximately 4 to 6 V depending on the number of diodes. If it were desired to integrate a concept of this type into a field effect trench transistor, this would result in disadvantages of a very large space requirement, for example in the chip edge region, and poor integrability into the process flow.

Many field effect trench transistors are usually subjected to an optimization of their on resistance relative to their gate charge or their gate capacitance in that a portion of the trenches (for example, every second trench) are formed as inactive trenches in which there are no gate electrodes arranged. This optimization is generally referred to as FoM (Figure of Merit) optimization.

SUMMARY

One embodiment of the invention integrates polysilicon diodes required for ESD strength and/or polysilicon zener diodes that serve for the zenering of the trench transistor in an FoM-optimized field effect trench transistor such that these diodes need only a small space requirement on the chip and that their integration is compatible with a process flow used for the fabrication of the field effect trench transistor.

One embodiment of the present invention integrates the polysilicon protective diodes serving for the ESD strength and/or the polysilicon zener diodes in the inactive trenches present anyway in the FoM-optimized field effect trench transistor. Since no electrodes of the field effect trench transistor lie in the inactive trenches, the polysilicon protective diodes or the zener diodes may lie in a manner buried below the silicon surface in the active trenches either in the chip edge and/or under the gate pad or in the inactive trenches in the vicinity of the gate pad. For the case where the p-type zones of the protective diodes are not implanted as far as the trench bottom, that is to say that the p-type zones of the protective diodes are implanted near the surface, the individual protective diodes are divided between a plurality of shorter trenches lying one behind the other in a series, and mutually facing electrodes of the protective diodes lying in the individual trenches are contact-connected to one another by an auxiliary metallization above the silicon surface.

The protective diodes in the inactive trenches can in one case be applied to a concept of a dense trench transistor that is FoM-optimized with regard to a low gate charge, in the case of which every second trench is embodied with thick oxide in order to reduce the gate capacitances and is simultaneously connected to source potential. If, in this case, the source connection is embodied in this trench on the chip side that is remote from the gate connection, then the full length of such trenches can be used for the ESD protective diode structures.

In the same way, it is possible, instead of this or in addition, to realize a zenering between gate and drain by means of polysilicon zener diodes in one or more of the inactive trenches. In this case, however, instead of the one source connection, a connection is produced at drain potential, and the respective directly adjacent transistor cells are to be deactivated and equipped with thick oxide in the trenches in order that the drain potential can be conducted into the trench filled with the polysilicon zener diodes without early breakdowns.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
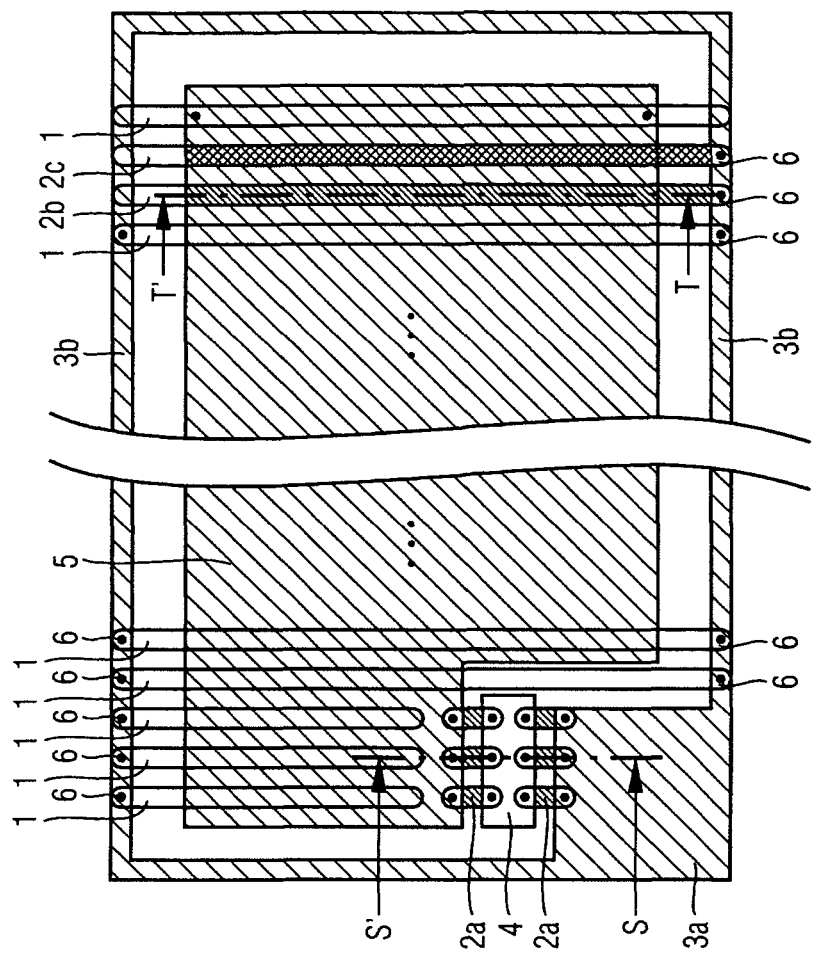
FIG. 1 illustrates a field effect trench transistor chip, with one exemplary embodiment of the invention illustrated on the left-hand side and another exemplary embodiment of the invention illustrated on the right-hand side of FIG. 1.

The layout plan view in FIG. 1 illustrates an example of a field effect trench transistor. The transistor array has a multiplicity of transistor cells whose gate electrodes are arranged in active trenches 1 that run parallel. Parallel to the active trenches 1 the field effect trench transistor illustrated also has inactive trenches 2a, 2b, 2c in which no electrodes of the transistor cells are situated.

In these inactive trenches 2a, 2b, 2c, for the ESD protection polysilicon protective diodes are integrated in one embodiment of the invention in such a way that they prevent an electrostatic charging of the gate oxide. For this purpose, the polysilicon protective diodes are connected in series one behind the other in a number such that the sum of their reverse voltages is greater than or equal to the required ESD protective voltage (each protective diode has a reverse voltage of approximately 4 to 6 V for example).

In the case of the exemplary embodiment illustrated on the left in FIG. 1, the polysilicon protective diodes are incorporated in trenches under a gate pad 3a or into the adjacent inactive trenches 2a, 2a. For $p^+$-type zones implanted near the surface (the n-type polysilicon is in some cases not redoped as far as the bottom of the trench), the individual polysilicon protective diodes are separated into individual trenches 2a, 2a. In the case of $p^+$-type zones that reach as far as the trench bottom, it is possible largely to dispense with the separation in the trench plane. In order to connect the polysilicon protective diodes in the individual trench sections 2a, 2a to one another, an auxiliary metallization 4 is required, as can be seen in the sectional view depicted along the sectional plane S-S' in FIG. 2A.

Figure 2:
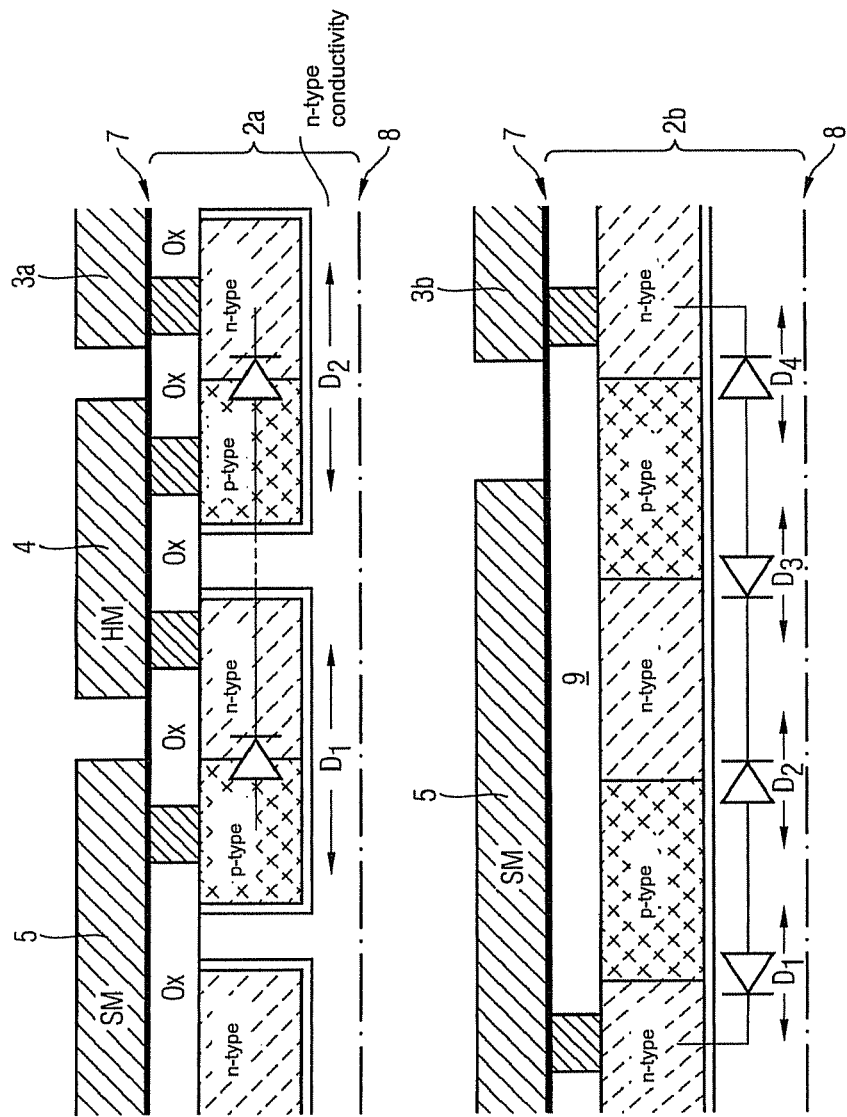
FIG. 2A illustrates a sectional view along the sectional plane S-S' illustrating the exemplary embodiment in accordance with FIG. 1.
FIG. 2B illustrates a schematic sectional view along the sectional plane T-T' illustrating the exemplary embodiment in accordance with FIG. 1.
Figure 3:
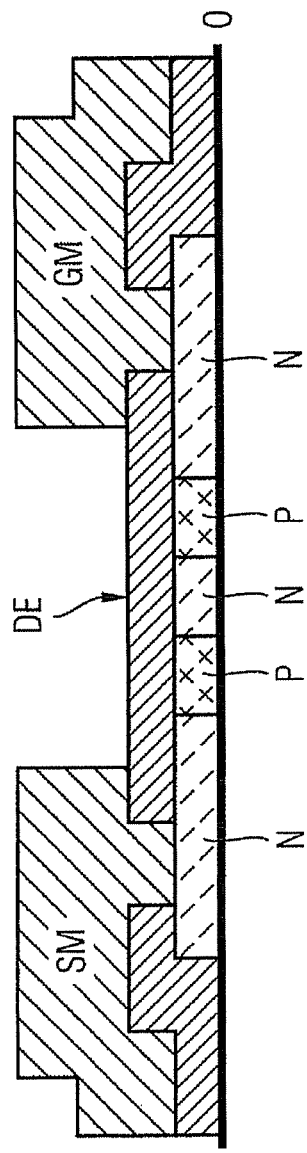
FIG. 3 illustrates a conventional ESD protective structure of an IGBT in which the polysilicon protective diodes lie above the silicon surface.

FIG. 2A illustrates by way of example only two polysilicon protective diodes D1, D2, which are contact-connected to source metal 5 at one of their ends and to said gate pad 3a at their other end. As illustrated in FIG. 2A, the p-type polysilicon zones in the trench 2a do not reach as far as the trench bottom, rather an n-type polysilicon layer remains underneath. Apart from their contact-connections via the silicon surface 7 to the metallizations 3a, 4, 5, the polysilicon protective diodes D1, D2 in the trench 2a are insulated by an insulation oxide OX.

FIG. 1 illustrates another exemplary embodiment on the right, in which the polysilicon protective diodes are incorporated into inactive trenches 2b, that is, into trenches that have already been connected to source potential anyway for capacitance reasons. In an "FOM-optimized" dense trench concept in which every second trench 2b is an inactive trench, the polysilicon protective diodes are in one case accommodated in one or a plurality, if appropriate in all, of said inactive trenches.

The cross-sectional structure of the exemplary embodiment (FIG. 1 on the right) is illustrated in FIG. 2B, which illustrates a sectional view along the sectional plane T-T' of FIG. 1. As mentioned, in principle any desired number of inactive trenches 2b, which may themselves occur in any desired order and number, may be used in order to form one or more series-connected polysilicon protective diodes D1-D4 therein. The connections thereof to gate metal 3b and to source metal 5 may in this case be positioned in any desired positions along said inactive trenches 2b. In accordance with FIG. 1, a so-called gate runner 3b, that is, an interconnect at gate potential leading around the entire transistor array, leads around the transistor array proceeding from the gate pad 3a. In accordance with FIG. 1 on the right and FIG. 2B, the series of polysilicon protective diodes D1-D4 is contact-connected to said gate runner 3b at one of their ends and to the source metallization 5 at any desired location at their other end. The polysilicon protective diodes D1-D4 are insulated in the trench 2b by an overlying intermediate oxide 9 reaching as far as the silicon surface 7. FIG. 2B illustrates by way of example that the p-type polysilicon implantations reach as far as the trench bottom 8.

By virtue of the variable interconnection as polysilicon diode or inactive trench, it is possible to achieve an optimization between ESD strength and leakage current depending on the product requirement.

The reference numeral 6 in FIG. 1 indicates the contacts of gate metal on polysilicon in the trenches 1.

FIG. 1 illustrates a further exemplary embodiment, in which one or more series-connected polysilicon zener diodes are integrated in a further inactive trench 2c (there may also be a plurality of further inactive trenches 2c) and are contact-connected to the metal of the gate runner 3b by one of its or their ends and to drain potential by its or their other end. It is thus possible, in the same way as was described previously for the polysilicon protective diodes in the inactive trenches, to realize a zenering between gate and drain of the field effect trench transistor by means of polysilicon zener diodes. In this case, however, instead of the one source connection, it is necessary to produce a connection to drain potential and the respective directly adjacent cells are to be deactivated and equipped with thick oxide in the trenches in order to receive the drain potential into the trench 2c with the polysilicon zener diodes without early breakdowns.

One embodiment of the invention can be applied to all trench technologies, and in one case to technologies with a plurality of electrodes in the trench, since it can be integrated very easily there, particularly when the individual electrodes in the trench are of different heights or of different doping types anyway.

In order that the polysilicon diodes can be introduced with the least additional outlay, the deposition of the gate polysilicon into DMOS trenches is intended to be effected in parallel with the deposition into the trenches with the ESD protective diodes, and in one case in an in-situ doping in the range around a few $10^{18}/cm^3$ of the n conduction type (phosphorus/arsenic/etc.). In the further course of the process, the gate polysilicon in the DMOS trenches is reinforced by the source implantation. If the gate doping in the DMOS transistor is not of sufficient magnitude in the channel region, it is possible, by means of an additional phototechnique, for an $n^+$-type doping to be introduced prior to the body drive into the polysilicon in the trench and to be distributed at least at the level of the channel region by the drive. In the structure of the ESD protective diodes, it is possible, in the further course of the process, by means of the existing $p^+$-type body contact phototechnique, to introduce the $p^+$-type doping zones into the n-type doped polysilicon by means of redoping. The buried ESD polysilicon diodes thus formed in the trenches can be introduced in a manner electrically connected between gate metal and source metal through diverse interconnection by means of the gate contact phototechnique. In the case of the gate contact phototechnique, the polysilicon situated in the trenches is enclosed by means of a contact hole aligned with the trench center and subsequent metallization.

The above description has described exemplary embodiments of a structure of a field effect trench transistor according to the invention and an exemplary fabrication method for a field effect trench transistor according to the invention. A multiplicity of transistor cells arranged like an array have gate electrodes lying in active trenches formed in a semiconductor body. Inactive trenches lie parallel to the active trenches in the array of the transistor cells, there being no gate electrodes arranged in said inactive trenches. According to an embodiment of the invention, a series of polysilicon protective diodes and/or zener diodes is integrated in one or more of the inactive trenches. The protective diodes, which serve for protection against electrostatic charging of the gate oxide, are contact-connected to a source metallization at one of their ends and to a gate metallization at their other end, while the polysilicon zener diodes are connected to gate metal at one end and are contact-connected to drain potential at the other end.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A field effect trench transistor comprising:
a multiplicity of trenches formed from a silicon surface of a semiconductor, said trenches running in parallel to one another and in a longitudinal direction parallel to the silicon surface of the semiconductor, including a plurality of stripe-shaped active trenches and at least two inactive trenches, which are adjacent to each other and a multiplicity of transistor cells arranged as an array of transistor cells and having gate electrodes lying in the active trenches;
wherein the at least two inactive trenches lie in the array of the transistor cells between the active trenches and includes no gate electrodes but a plurality of polysilicon protective diodes which are integrated in the at least two inactive trenches, isolated by an oxide layer, connected in form of a series connection with one another in the longitudinal direction of the at least two inactive trenches, and are contact-connected at one end of the series connection of the plurality of polysilicon protective diodes to a gate metallization and at the opposite end of the series connection of the plurality of polysilicon protective diodes to a source metallization of the field effect trench transistor.

2. The field effect trench transistor of claim 1, wherein the trenches comprise two or more of said inactive trenches, wherein every other trench provides one of said inactive trenches.

3. The field effect trench transistor of claim 1, wherein said plurality of polisilicon protective diodes lie in said at least two inactive trenches below the silicon surface of the semiconductor.

4. The field effect trench transistor of claim 1, wherein said plurality of polysilicon protective diodes lie in said at least two inactive trenches adjacent to a gate pad of the field effect trench transistor and is connected at said one end of the series connection of said plurality of polysilicon protective diodes to said gate pad.

5. The field effect trench transistor of claim 4, wherein the plurality of polysilicon protective diodes comprises p-type implantation zones, and said at least two inactive trenches are divided into the longitudinal direction of said at least two inactive trenches into a plurality of shorter inactive trenches lying serially one behind another in said longitudinal direction of said at least two inactive trenches, and wherein mutually facing ends of the plurality of polysilicon protective diodes lying in the inactive trenches are contact-connected to one another by an auxiliary metallization above the silicon surface of the semiconductor.

6. The field effect trench transistor of claim 1, wherein inside the at least two inactive trenches above the plurality of polysilicon protective diodes, apart from each contact location of the polysilicon protective diodes is filled with oxide up to the silicon surface of the semiconductor.

7. A field effect trench transistor comprising:
a multiplicity of trenches formed from a silicon surface of a semiconductor, said trenches running in parallel to one another and in a longitudinal direction parallel to the silicon surface of the semicondutor, including a plurality of stripe-shaped active trenches and a plurality of inactive trenches, which are adjacent to each other; and
a multiplicity of transistor cells arranged as an array of the transistor cells having gate electrodes lying in the active trenches;
wherein said plurality of inactive trenches lie within the array of the transistor cells and include no gate electrodes but a plurality of protecting means which are integrated in at least two inactive trenches of said inactive trenches, isolated by an oxide layer, connected in form of a series connection with one another in the longitudinal direction of each of the inactive trenches, and are contact connected at one end of the series connection of the protecting means to a gate metallization and at the opposite end of the series connection of the protecting means to a source metallization of said field effect trench transistor.

8. The field effect trench transistor of claim 7, wherein every other trench provides one of said inactive trenches.

9. The field effect trench transistor of claim 7, wherein the protecting means further include a plurality of polysilicon protective diodes.

10. The field effect trench transistor of claim 9, wherein the plurality of protective diodes lie in the plurality of the inactive trenches below the silicon surface of the semiconductor.

11. The field effect trench transistor of claim 9, further including one or more polysilicon zener diodes integrated in one or more of the inactive trenches.

12. A field effect trench transistor comprising:
a multiplicity of transistor cells arranged as an array of transistor cells;
a plurality of stripe-shaped active and inactive trenches formed from a silicon surface of a semiconductor;
wherein the active trenches and the inactive trenches run in parallel to one another and in a longitudinal direction parallel to the silicon surface of the semiconductor;
wherein gate electrodes of said multiplicity of transistor cells lie in the active trenches; and
wherein at least two inactive trenches of the plurality of stripe-shaped inactive trenches, which are adjacent to each other lie in the array of the transistor cells and includes no gate electrodes but a plurality of polysilicon protective diodes which are integrated in the at least two inactive trenches, isolated by an oxide layer, connected in form of a series connection with one another in the longitudinal direction of the at least two inactive trenches and are contact-connected at one end of the series connection of the plurality of polysilicon protective diodes to a gate metallization and at the opposite end of the series connection of the plurality of polysilicon protective diodes to a source metallization of the field effect trench transistor.

* * * * *